(12) United States Patent
Zhan et al.

(10) Patent No.: US 10,782,575 B2
(45) Date of Patent: Sep. 22, 2020

(54) ARRAY SUBSTRATE AND DISPLAY PANEL, AND FABRICATION METHODS THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Hongming Zhan, Beijing (CN); Xibin Shao, Beijing (CN); Yu Ma, Beijing (CN); Chao Tian, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/414,515

(22) Filed: May 16, 2019

(65) Prior Publication Data

US 2019/0271889 A1  Sep. 5, 2019

Related U.S. Application Data

(63) Continuation-in-part of application No. 15/567,223, filed as application No. PCT/CN2017/081037 on Apr. 19, 2017, now Pat. No. 10,361,227.

(30) Foreign Application Priority Data

May 27, 2016 (CN) .......................... 2016 1 0365139

(51) Int. Cl.
*G02F 1/1362* (2006.01)
*H01L 27/12* (2006.01)
(Continued)

(52) U.S. Cl.
CPC ...... *G02F 1/136213* (2013.01); *G02F 1/1368* (2013.01); *G02F 1/13439* (2013.01);
(Continued)

(58) Field of Classification Search
CPC .............. H01L 27/1255; H01L 27/124; H01L 27/1259; H01L 27/1248; G02F 1/136213; G02F 1/133514; G02F 1/13439
(Continued)

(56) References Cited

U.S. PATENT DOCUMENTS 6,002,462 A    12/1999  Sato et al.
10,054,827 B2   8/2018  Ye
(Continued)

FOREIGN PATENT DOCUMENTS

CN    101211078 A    7/2008
CN    101290410 A    10/2008
(Continued)

OTHER PUBLICATIONS

International Search Report & Written Opinion dated Jul. 25, 2017, regarding PCT/CN2017/081037.
(Continued)

*Primary Examiner* — Thinh T Nguyen
(74) *Attorney, Agent, or Firm* — Intellectual Valley Law, P.C.

(57) ABSTRACT

Array substrate and display panel, and their fabrication methods are provided. The array substrate includes a first base substrate; a pixel electrode over the first base substrate; a first common electrode between the first base substrate and the pixel electrode; and a storage capacitor electrode, between the pixel electrode and the first common electrode and coupled with one of the pixel electrode and the first common electrode. Projections of the first common electrode and the pixel electrode on the first base substrate at least partially overlap with each other.

20 Claims, 6 Drawing Sheets

(51) Int. Cl.
*G02F 1/1335* (2006.01)
*G02F 1/1343* (2006.01)
*G02F 1/1368* (2006.01)

(52) U.S. Cl.
CPC .. *G02F 1/133514* (2013.01); *G02F 1/134309* (2013.01); *G02F 1/136286* (2013.01); *H01L 27/124* (2013.01); *H01L 27/1255* (2013.01); *H01L 27/1259* (2013.01); *H01L 27/1248* (2013.01)

(58) Field of Classification Search
USPC ........... 257/59, 71, 72, 81; 438/48, 128, 149
See application file for complete search history.

(56) References Cited

U.S. PATENT DOCUMENTS

| | | |
|---|---|---|
| 2006/0119771 A1 | 6/2006 | Lim et al. |
| 2008/0158464 A1 | 7/2008 | Chang et al. |
| 2008/0259256 A1 | 10/2008 | Dong |
| 2009/0303422 A1 | 12/2009 | Kim et al. |
| 2011/0149183 A1* | 6/2011 | Cho et al. ........... G02F 1/13394 349/38 |
| 2017/0153509 A1 | 6/2017 | Ye |
| 2017/0160610 A1 | 6/2017 | Ye |

FOREIGN PATENT DOCUMENTS

| | | |
|---|---|---|
| CN | 102768445 A | 11/2012 |
| CN | 103278986 A | 9/2013 |
| CN | 104199220 A | 12/2014 |
| CN | 105044973 A | 11/2015 |
| CN | 105116651 A | 12/2015 |
| CN | 205920298 U | 2/2017 |
| JP | 3420675 B2 | 6/2003 |

OTHER PUBLICATIONS

Notice of Allowance in the U.S. Appl. No. 15/567,223, dated Mar. 12, 2019.
Non-Final Office Action in the U.S. Appl. No. 15/567,223, dated Nov. 28, 2018.
Response to Non-Final Office Action in the U.S. Appl. No. 15/567,223, dated Feb. 11, 2019.
Restriction Requirement in the U.S. Appl. No. 15/567,223, dated Aug. 9, 2018.
Response to Restriction Requirement in the U.S. Appl. No. 15/567,223 dated Sep. 19, 2018.

* cited by examiner

ARRAY SUBSTRATE AND DISPLAY PANEL, AND FABRICATION METHODS THEREOF

CROSS-REFERENCES TO RELATED APPLICATIONS

This application is a continuation-in-part of U.S. application Ser. No. 15/567,223, filed Apr. 19, 2017, which is a national stage application under 35 U.S.C. § 371 of International Application No. PCT/CN2017/081037, filed Apr. 19, 2017, which claims priority to Chinese Patent Application No. 201610365139.5, filed on May 27, 2016. Each of the forgoing applications is herein incorporated by reference in its entirety for all purposes.

FIELD OF THE DISCLOSURE

The present disclosure generally relates to the field of display technology and, more particularly, relates to array substrate and display panel, and fabrication methods thereof.

BACKGROUND

Conventional array substrates used for liquid crystal display (LCD) devices may include a storage capacitor. The storage capacitor may include a large distance between electrodes. This large distance may affect the capacitance of the storage capacitor and may thus affect display results.

The disclosed array substrate and display panel, and fabrication methods thereof are directed to solve one or more problems set forth above and other problems.

BRIEF SUMMARY OF THE DISCLOSURE

In accordance with some embodiments of the present disclosure, an array substrate and a display panel, and their fabrication methods are provided.

One aspect of present disclosure provides an array substrate. The array substrate includes a first base substrate; a pixel electrode over the first base substrate; a first common electrode between the first base substrate and the pixel electrode; and a storage capacitor electrode, between the pixel electrode and the first common electrode and coupled with one of the pixel electrode and the first common electrode. Projections of the first common electrode and the pixel electrode on the first base substrate at least partially overlap with each other.

Optionally, the array substrate further includes: a color resist, over the first base substrate and between the pixel electrode and the storage capacitor electrode.

Optionally, the storage capacitor electrode is electrically connected with the pixel electrode through a first via hole in the color resist.

Optionally, the storage capacitor electrode is between the first common electrode and the color resist; and the storage capacitor electrode is electrically connected with the first common electrode through a second via hole.

Optionally, the array substrate further includes: an organic film layer between the color resist and the pixel electrode.

Optionally, the color resist includes sub-color resists having a gap between adjacent sub-color resists; the gap is located corresponding to the first common electrode; and the pixel electrode is at least partially in the gap.

Optionally, each sub-color resist in the color resist corresponds to a single sub-pixel.

Optionally, a projection of the gap on the first base substrate substantially covers the first common electrode.

Optionally, the projection of the storage capacitor electrode on the first base substrate substantially covers the first common electrode.

Optionally, the array substrate further includes: a source/drain electrode, wherein the storage capacitor electrode is in a same layer as the source/drain electrode.

Optionally, the array substrate further includes: a gate electrode, wherein the first common electrode is in a same layer as the gate electrode.

Another aspect of present disclosure provides a display panel. The display panel includes the disclosed array substrate; a second base substrate; and a second common electrode on the second base substrate. The pixel electrode in the array substrate and the second common electrode are placed toward each other to assemble the first base substrate with the second base substrate.

Another aspect of present disclosure provides a method for forming an array substrate, by forming a pixel electrode over a first base substrate; forming a first common electrode between the first base substrate and the pixel electrode; and forming a storage capacitor electrode, between the pixel electrode and the first common electrode and coupled with one of the pixel electrode and the first common electrode. Projections of the first common electrode and the pixel electrode on the first base substrate overlap with each other.

Optionally, the method further includes: forming a color resist, over the first base substrate and between the pixel electrode and the storage capacitor electrode.

Optionally, the storage capacitor electrode is electrically connected with the pixel electrode through a first via hole in the color resist.

Optionally, the storage capacitor electrode is between the first common electrode and the color resist; and the storage capacitor electrode is electrically connected with the first common electrode through a second via hole.

Optionally, the color resist includes sub-color resists having a gap between adjacent sub-color resists; the gap is located corresponding to the first common electrode; and the pixel electrode is at least partially in the gap.

Optionally, each sub-color resist in the color resist corresponds to a single sub-pixel; and a projection of the gap on the first base substrate substantially covers the first common electrode.

Optionally, the method further includes: forming a source/drain electrode, wherein the storage capacitor electrode is in a same layer as the source/drain electrode.

Optionally, the method further includes: forming a gate electrode, wherein the first common electrode is in a same layer as the gate electrode.

Other aspects of the present disclosure can be understood by those skilled in the art in light of the description, the claims, and the drawings of the present disclosure.

In another aspect, the present disclosure provides an array substrate, comprising a first base substrate; a first electrode on the first base substrate; a first insulating layer on a side of the first electrode away from the first base substrate; a storage capacitor electrode on a side of the first insulating layer away from the first electrode; a second insulating layer on a side of the storage capacitor electrode away from the first insulating layer; and a pixel electrode on a side of the second insulating layer away from the storage capacitor electrode; wherein the storage capacitor electrode is electrically connected to one but not the other of the first electrode and the pixel electrode; the first electrode and the pixel electrode are configured to form a storage capacitor through the storage capacitor electrode; and an orthographic projection of the storage capacitor electrode on the first base substrate at least partially overlaps with an orthographic projection of the other of the first electrode and the pixel electrode on the base substrate.

Optionally, the storage capacitor electrode and a drain electrode of a thin film transistor are integrally connected parts of a unitary electrode block.

Optionally, the array substrate further comprises a color resist over the first base substrate and between the pixel electrode and the second insulating layer.

Optionally, the color resist includes sub-color resists having a gap between adjacent sub-color resists; and the pixel electrode is at least partially in the gap.

Optionally, the gap is located in a region corresponding to the first electrode.

Optionally, the storage capacitor electrode is electrically connected with the pixel electrode through a via hole extending through the second insulating layer in a region corresponding to the gap.

Optionally, an orthographic projection of the first electrode on the first base substrate at least partially overlaps with the orthographic projection of the storage capacitor electrode on the first base substrate; and the orthographic projection of the first electrode on the first base substrate at least partially overlaps with an orthographic projection of a portion of the pixel electrode in the gap on the first base substrate.

Optionally, the storage capacitor electrode is electrically connected with the first electrode through a via hole extending through the first insulating layer in a region corresponding to the gap.

Optionally, an orthographic projection of the first electrode on the first base substrate at least partially overlaps with an orthographic projection of a portion of the pixel electrode in the gap on the first base substrate; and the orthographic projection of the first electrode on the first base substrate at least partially overlaps with the orthographic projection of the storage capacitor electrode on the first base substrate.

Optionally, the gap is located in a region outside that of the first electrode.

Optionally, the storage capacitor electrode is electrically connected with the pixel electrode through a via hole extending through the second insulating layer in a region corresponding to the gap.

Optionally, an orthographic projection of the first electrode on the first base substrate is substantially non-overlapping with an orthographic projection of the pixel electrode on the first base substrate; the orthographic projection of the storage capacitor electrode on the first base substrate covers the orthographic projection of the first electrode on the first base substrate; and the orthographic projection of the storage capacitor electrode on the first base substrate at least partially overlaps with an orthographic projection of a portion of the pixel electrode in the gap on the first base substrate.

Optionally, the storage capacitor electrode is electrically connected with the first electrode through a via hole extending through the first insulating layer in a region outside that of the gap.

Optionally, an orthographic projection of the first electrode on the first base substrate is substantially non-overlapping with an orthographic projection of the pixel electrode on the first base substrate; the orthographic projection of the storage capacitor electrode on the first base substrate covers an orthographic projection of a portion of the pixel electrode in the gap on the first base substrate; and the orthographic projection of the storage capacitor electrode on the first base substrate at least partially overlaps with the orthographic projection of the first electrode on the first base substrate.

Optionally, each sub-color resist in the color resist corresponds to a single sub-pixel.

Optionally, an orthographic projection of the storage capacitor electrode on the first base substrate substantially covers an orthographic projection of the first electrode on the first base substrate.

Optionally, the array substrate further comprises a source/drain electrode, wherein the storage capacitor electrode is in a same layer as the source/drain electrode.

Optionally, the array substrate further comprises a gate electrode, wherein the first electrode is in a same layer as the gate electrode In another aspect, the present disclosure provides a display panel, comprising the array substrate described herein or fabricated by a method described herein; a second base substrate; and a second electrode on the second base substrate; wherein the pixel electrode in the array substrate and the second electrode are placed toward each other to assemble the first base substrate with the second base substrate; the first electrode is a first common electrode; the second electrode is a second common electrode; the first common electrode and the second common electrode are electrically connected to a common voltage signal line in a peripheral area of the display panel; and the common voltage signal line is configured to provide a common voltage to the first common electrode and the second common electrode.

In another aspect, the present disclosure provides a method for forming an array substrate, comprising forming a first electrode on a first base substrate; forming a first insulating layer on a side of the first electrode away from the first base substrate; forming a storage capacitor electrode on a side of the first insulating layer away from the first electrode; forming a second insulating layer on a side of the storage capacitor electrode away from the first insulating layer; and forming a pixel electrode on a side of the second insulating layer away from the storage capacitor electrode; wherein the storage capacitor electrode is formed to be electrically connected to one but not the other of the first electrode and the pixel electrode; the first electrode and the pixel electrode are configured to form a storage capacitor through the storage capacitor electrode; and an orthographic projection of the storage capacitor electrode on the first base substrate at least partially overlaps with an orthographic projection of the other of the first electrode and the pixel electrode on the base substrate.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference input now be made in detail to exemplary embodiments of the invention, which are illustrated in the accompanying drawings in order to fully understand and being able to implementing the present disclosure and to realizing the technical effect. It should be understood that the following description has been made only by way of example, but not to limit the present disclosure.

Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

In accordance with various embodiments, the present disclosure provides an array substrate, a display panel, and a display device, along with their fabrication methods. A display device may include a display panel, which may include an array substrate.

In some embodiments, the disclosed display device may be a curved display device including a corresponding display panel having a suitable array substrate. For example, a curved display device may include a twisted nematic (TN) mode pixel structure and may include a bent display panel having substrates without deformation.

For illustration purposes, FIGS. 1-6 illustrate schematic structural views of curved display devices as examples in accordance with various embodiments of the present disclosure, although any appropriate display device, such as non-curved display devices or flat display devices, may be encompassed in the present disclosure.

Figure 1:
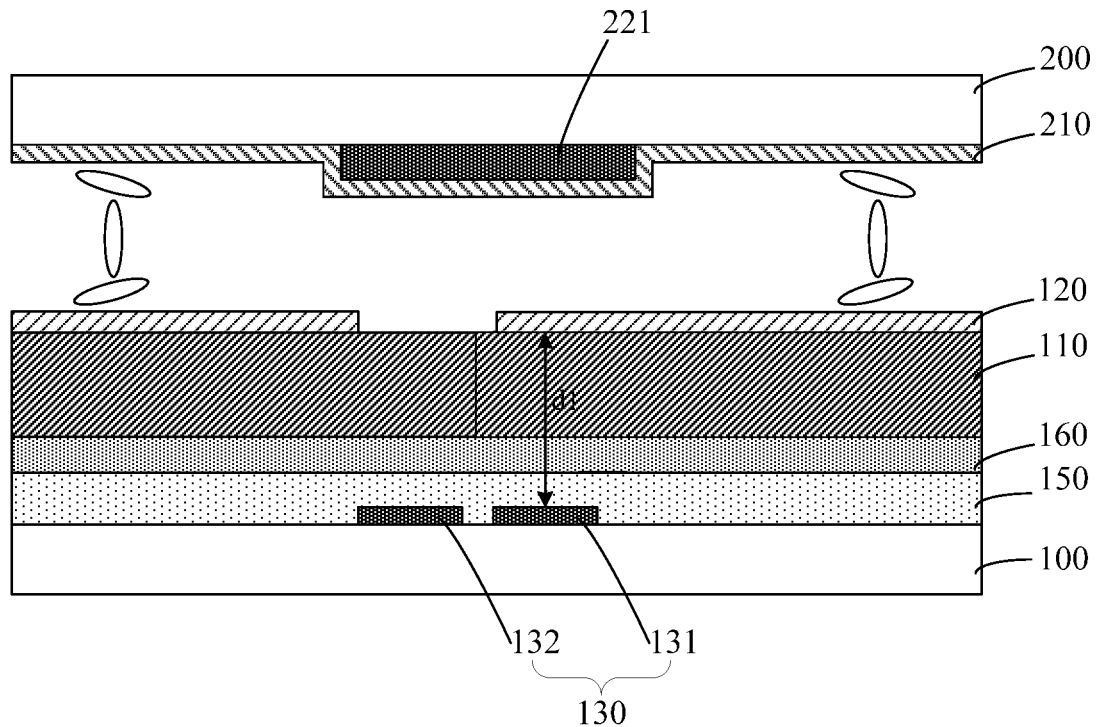
FIG. 1 illustrates a schematic structural view of an exemplary curved display device in accordance with some embodiments of the present disclosure.

As illustrated in FIG. 1, the curved display device can include a first base substrate 100 and a second base substrate 200, which can be paired and assembled together. A color resist 110 can be disposed over the first based substrate 100. A pixel electrode layer 120 can be disposed on the color resist 110. A second common electrode layer 210 can be provided on the second base substrate 200.

In the disclosed curved display device, in the TN mode, the color resist 110 is provided on the first substrate 100 on which the pixel electrode layer 120 is provided. As such, in the disclosed the curved display device, each sub-color resist corresponds to a single sub-pixel, so that each sub-pixel has only one color. Therefore, the color mixing problem caused by the misaligned bent upper and lower substrates having multiple color resists in a same sub-pixel can be effectively solved.

In addition, comparing to the conventional compensation method of widening the black matrixes on the side closed to the color film substrate, in the disclosed embodiments, by providing the color resist 110 on the first substrate 100 on which the pixel electrode layer 120 is provided, not only the problem of color mixing of the curved display device can be solved, but also an alignment tolerance between the first base substrate 100 and the second base substrate 200 can be effectively reduced. Therefore, the width of the black matrixes can be reduced, thereby increasing the transmittance of the curved display device.

Figure 2:
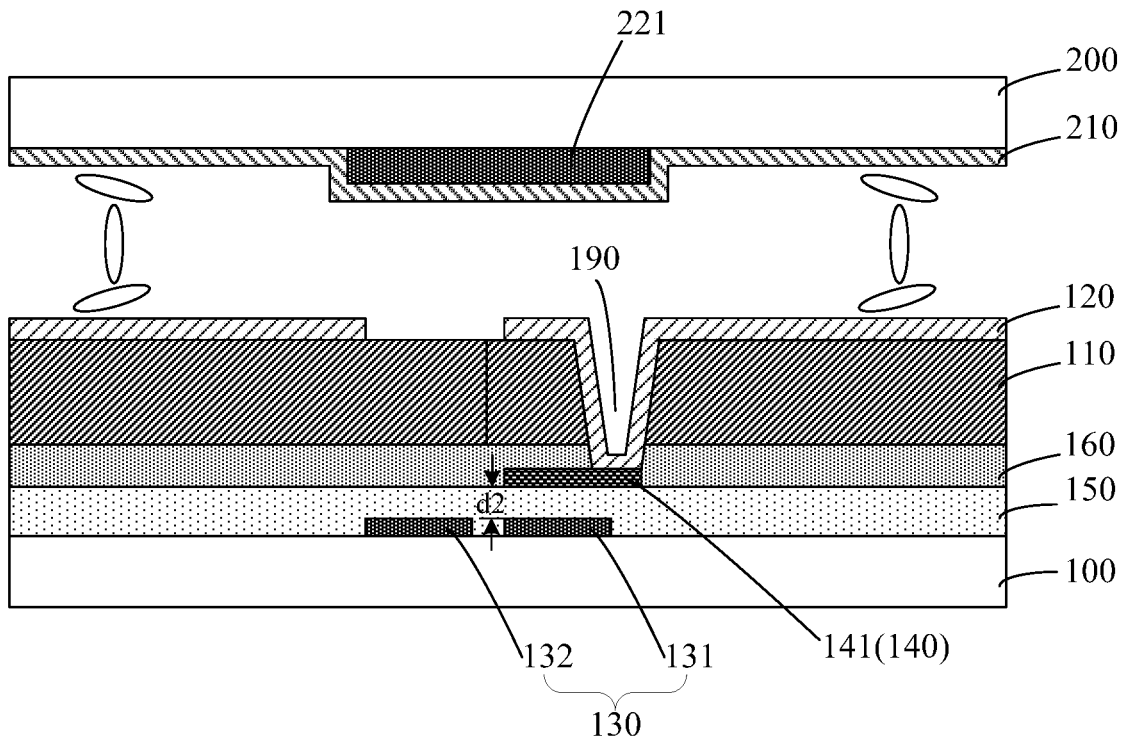
FIG. 2 illustrates a schematic structural view of another exemplary curved display device in accordance with some other embodiments of the present disclosure.
Figure 3:
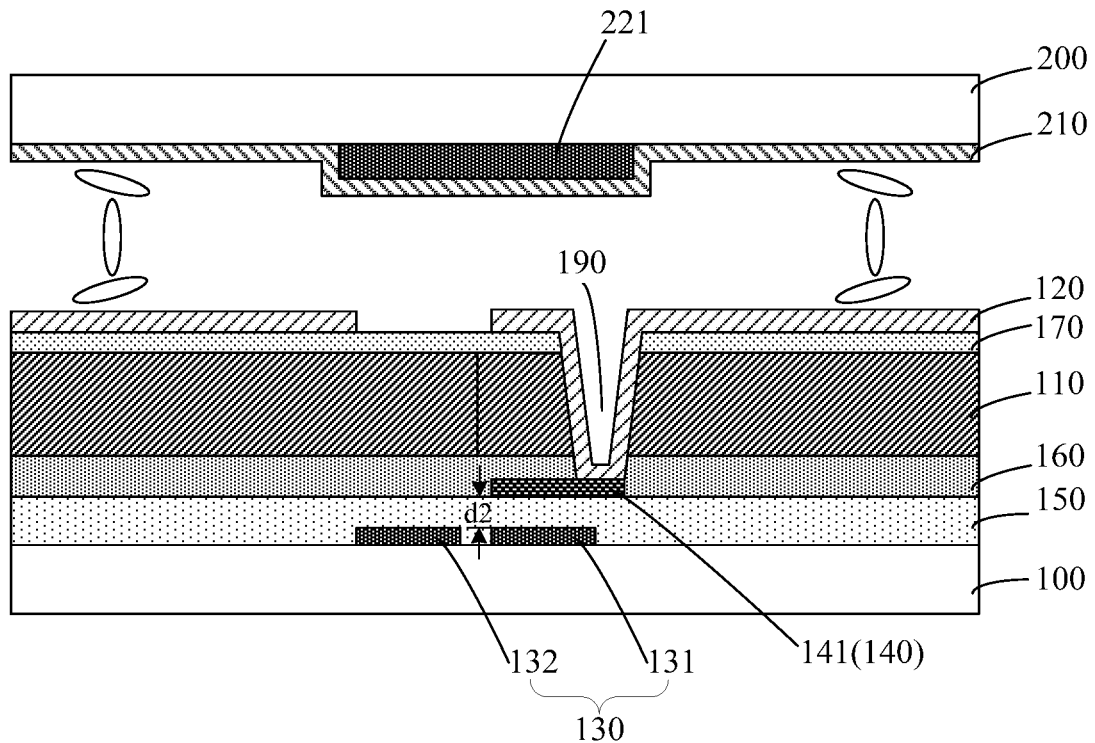
FIG. 3 illustrates a schematic structural view of another exemplary curved display device in accordance with some other embodiments of the present disclosure.

As shown in FIGS. 2 and 3, a first common electrode 131 can be disposed between the first base substrate 100 and the color resist 110. The first common electrode 131 and the pixel electrode in the pixel electrode layer 120 can form a storage capacitance. A storage capacitor electrode 141 corresponding to the first common electrode 131 can be provided between the first base substrate 100 and the color resist 110. The storage capacitor electrode 141 can be electrically connected to the pixel electrode in the pixel electrode layer 120. The first common electrode 131 and the second common electrode layer 210 may be electrically connected to a common voltage signal line in a peripheral area of the display panel. The common voltage signal line is configured to provide a common voltage to the first common electrode 131 and the second common electrode layer 210.

In the TN mode, in order to stabilize the pixel voltage and ensure display quality, reliability, etc., a storage capacitor can be generally disposed in parallel with the pixel electrode. For example, as shown in FIG. 1, the pixel electrode can be formed to cover the first common electrode (COM) 131 to form a storage capacitor.

A thickness of an RGB color resist film in the color resist 110 can be generally in a range from 1.5 μm to 3 μm. A thickness of the gate insulation layer 150, and the passivation layer 160 between the pixel electrode layer 120 and the first common electrode 131 can be generally in a range from 0.2 μm to 0.4 μm respectively. Since the thickness of the color resist 110 is about 8 times as large as the thickness of the gate insulating layer 150 and the passivation layer 160 when color resist 110 is formed on the first substrate 100, a decrease of the storage capacitance of the curved display device maybe resulted in.

Therefore, in the disclosed embodiments, the storage capacitor electrode 141 can be disposed between the first substrate 100 and the color resist 110, and can be electrically connected to the pixel electrode. As such, a distance between the two sides of the storage capacitor does not include the thickness of the color resist 110, so that the distance is reduced from d1 as shown in FIG. 1 to d2 as shown in FIG. 2. Therefore, the capacitance of the storage capacitor can be effectively increased.

Specifically, a source/drain electrode 140 can be provided between the first common electrode 131 and the color resist 110, and the storage capacitor electrode 141 can be disposed in the source/drain electrode 140. That is, the storage capacitor electrode 141 may be provided in the source/drain electrode 140, and may be formed simultaneously with the source/drain electrode 140. As such, the storage capacitor electrode 141 and the source/drain electrode 140 may be formed in a same layer.

Further, a material of the storage capacitor electrode 141 may be a metal. The storage capacitor electrode 141 may be made of a same material as of the source electrode (not shown in the figures) and the drain electrode (not shown in the figures) in the source/drain electrode 140.

As described above, although the storage capacitor electrode 141 is provided in some embodiments of the present disclosure, it is formed simultaneously with the source/drain electrode 140, and therefore does not increase a mask plate exposure number. That is, the present disclosure can ensure the capacitance of the storage capacitor without increasing the mask plate exposure number, thereby insuring a screen display quality of the curved display device.

The storage capacitor electrode 141 may be electrically connected to the pixel electrode through a via hole. As shown in FIGS. 2 and 3, a via hole 190 can be formed in the color resist 110, and the passivation layer 160 between the storage capacitor electrode 141 and the pixel electrode layer 120. The pixel electrode in the pixel electrode layer 120 can be electrically connected to the storage capacitor electrode 141 through the via hole 190. As such, a pixel structure design of the storage capacitor can be formed to reduce the distance between the two sides of the storage capacitor from d1 to d2, thereby increasing the capacitance of the storage capacitor.

Figure 4:
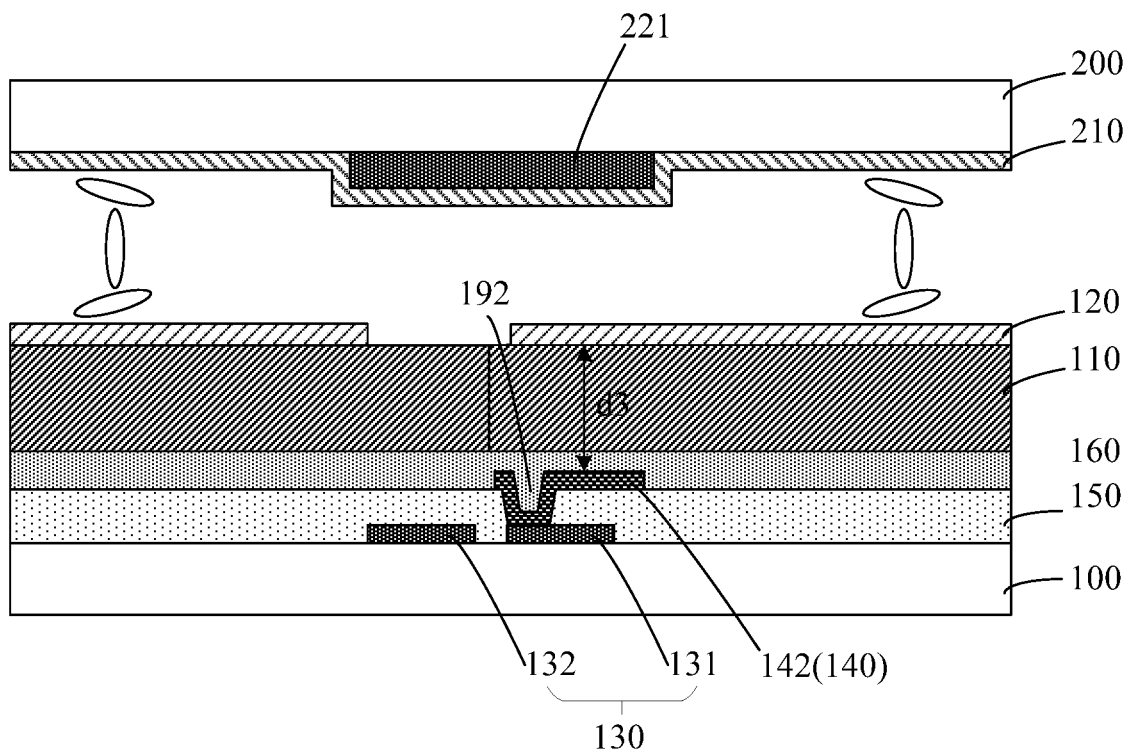
FIG. 4 illustrates a schematic structural view of another exemplary curved display device in accordance with some other embodiments of the present disclosure.
Figure 5:
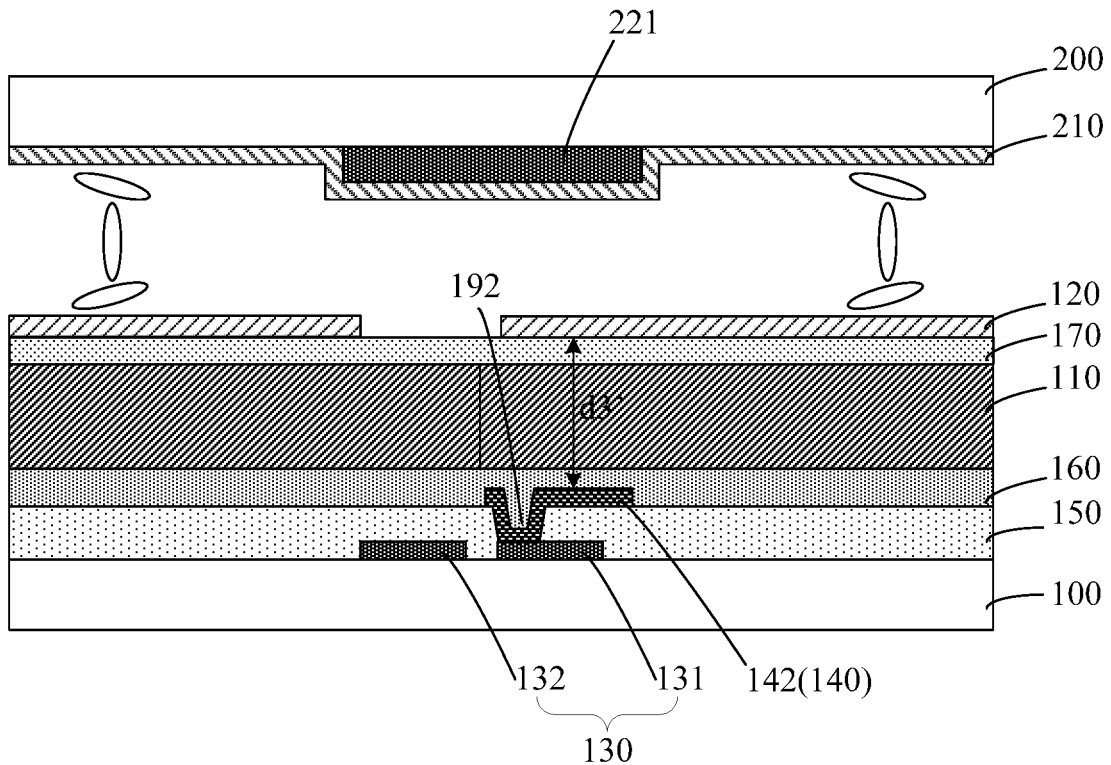
FIG. 5 illustrates a schematic structural view of another exemplary curved display device in accordance with some other embodiments of the present disclosure.

Further, a vertical projection of the storage capacitor electrode 141 on the first base substrate 100 can substantially completely cover the first common electrode 131, so that an effective area of the storage capacitor can be sufficiently ensured, thereby securing the capacitance of the storage capacitor In some other embodiments, as illustrated in FIGS. 4 and 5, the storage capacitor electrode between the first common electrode 131 and the color resist 110 may also be electrically connected to the first common electrode 131.

Specifically, a first common electrode 131 can be formed between the first substrate electrode 100 and the color resist 110. The first common electrode 131 and the pixel electrode in the pixel electrode layer 120 and the first common electrode 131 can form a storage capacitance. A storage capacitor electrode 142 can be disposed between the first common electrode 131 and the color resist. The storage capacitor electrode 142 can be electrically connected to the first common electrode 131.

Thus, the distance between the two sides of the storage capacitor does not include a thickness of the film layer between the storage capacitor electrode 142 and the first common electrode 131, so that the distance can be reduced from d1 shown in FIG. 1 to d3 shown in FIG. 4, or can be reduced to d3' shown in FIG. 5. Therefore, the capacitance of the storage capacitor can be effectively increased.

Similar as the embodiments shown in FIGS. 2 and 3, in the embodiments shown in FIGS. 4 and 5, the storage capacitor electrode 142 may also be disposed in the source/drain electrode 140, and may be formed simultaneously with the source electrode and the drain electrode in the source/drain electrode 140. Further, the storage capacitor electrode 142 may be made of metal, and the material of the storage capacitor electrode 142 may be the same as the material of the source electrode and the drain electrode in the source/drain electrode 140.

Thus, although the storage capacitor electrode 141 is added in some embodiments, it can be formed simultaneously with the source/drain electrode 140, and therefore does not increase a mask plate exposure number. That is, the present disclosure can ensure the capacitance of the storage capacitor without increasing the mask plate exposure number, thereby insuring a screen display quality of the curved display device.

The storage capacitor electrode 142 may be electrically connected to the first common electrode 131 through a via hole. As shown in FIGS. 4 and 5, a via hole 192 can be provided in the gate insulating layer 150 between the storage capacitor electrode 142 and the first common electrode 131. The storage capacitor electrode 142 may be connected to the first common electrode 131 through the via hole 192. As such, a pixel structure design of the storage capacitor can be formed to reduce the distance between the two sides of the storage capacitor from d1 shown in FIG. 1 to d3 shown in FIG. 4, or to d3' shown in FIG. 5, thereby Effectively improving the capacity of the storage capacitor.

Further, as shown in FIGS. 3 and 5, an organic film layer 170 can be disposed between the color resist 110 and the pixel electrode layer 120. The organic film layer 170 can cover the color resist 110, effectively alleviating the problem that the surface of the color resist 110 is not flat due to the inconsistency of the thicknesses of the RGB color resists in the color resist 110. The surface flatness of the first substrate 100 formed with the color resist 110 and the pixel electrode layer 120 can be improved, and the display quality can be therefore improved.

In some other embodiments, an island-like design of the color resist on the first base substrate 100 can be made to improve the capacitance of the storage capacitor.

Figure 6:
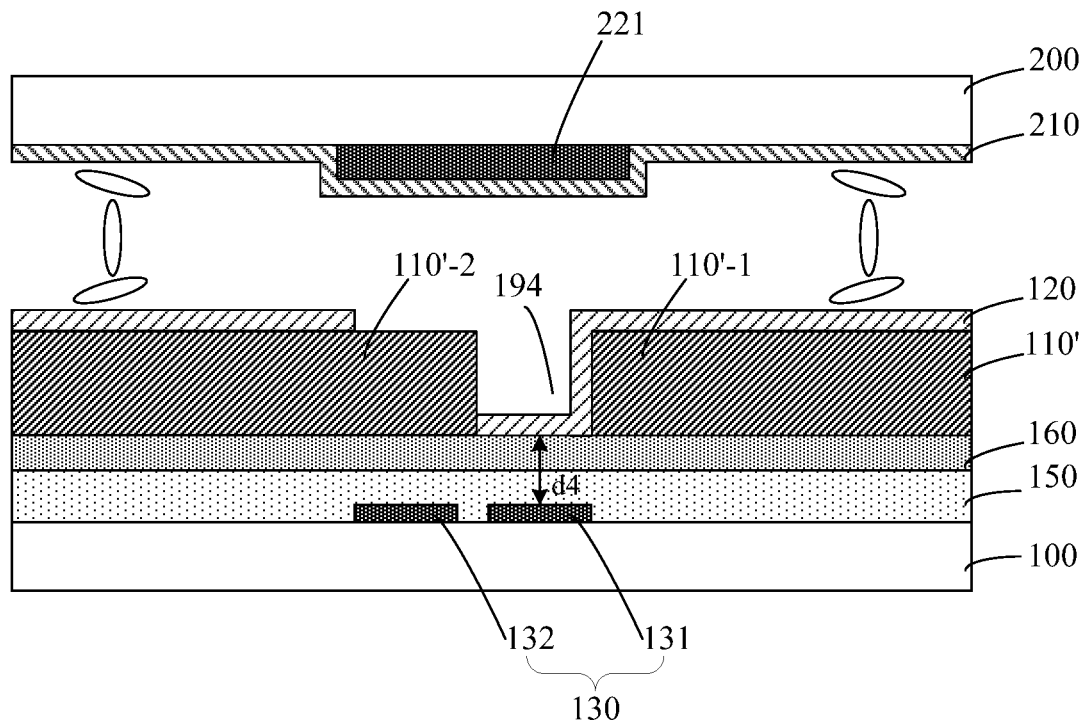
FIG. 6 illustrates a schematic structural view of another exemplary curved display device in accordance with some other embodiments of the present disclosure.

Specifically, as illustrated in FIG. 6, a first common electrode 131 can be formed between the first base substrate 100 and the color resist 110'. The first common electrode 131 and the pixel electrode in the pixel electrode layer 120 can form a storage capacitance. A gap 14 can be provided between adjacent sub-color resists 110'-1, 110'-2 in the color resist 110'. The cap 194 can be opposed to the first common electrode 131. A pixel electrode can be disposed in the cap 194. Thus, the distance between both sides of the storage capacitor does not include the thickness of the color resist 110', so that the distance is reduced from d1 to d4, effectively increasing the capacitance of the storage capacitor.

Further, a vertical projection of the gap 194 between the adjacent sub-color resists 110'-1 and 110'-2 on the first base substrate 100 can substantially completely cover the first common electrode 131. Therefore, an effective area of the storage capacitance can be ensured to secure the capacity of the storage capacitance.

In some embodiments, as illustrated in FIGS. 1 to 6, a black matrix 221 may be disposed on the second base substrate 200. In some other embodiments, a black matrix may be disposed on the first base substrate 100. And in particular, the black matrix may be disposed in the color resist.

The first common electrode 131 may be disposed in the gate electrode layer 130. That is, the first common electrode 131 and the gate electrode 132 may be formed in a same layer, which can be referred to as the gate electrode layer 130. Further, an active layer (not shown in the figures) can be provided between the gate insulating layer 150 and the source/drain electrode 140.

The disclosed curved display device can be used in the TN mode. The color resist can be moved from the conventional location of one side of color resist to the array substrate, which is the first base substrate described above. In the formed pixel structure, each sub-color resist can correspond to a single sub-pixel, so that each sub-pixel has only one color. Therefore, the color mixing problem caused by the misaligned bent upper and lower substrates having multiple color resists in a same sub-pixel can be effectively solved.

Figure 7:
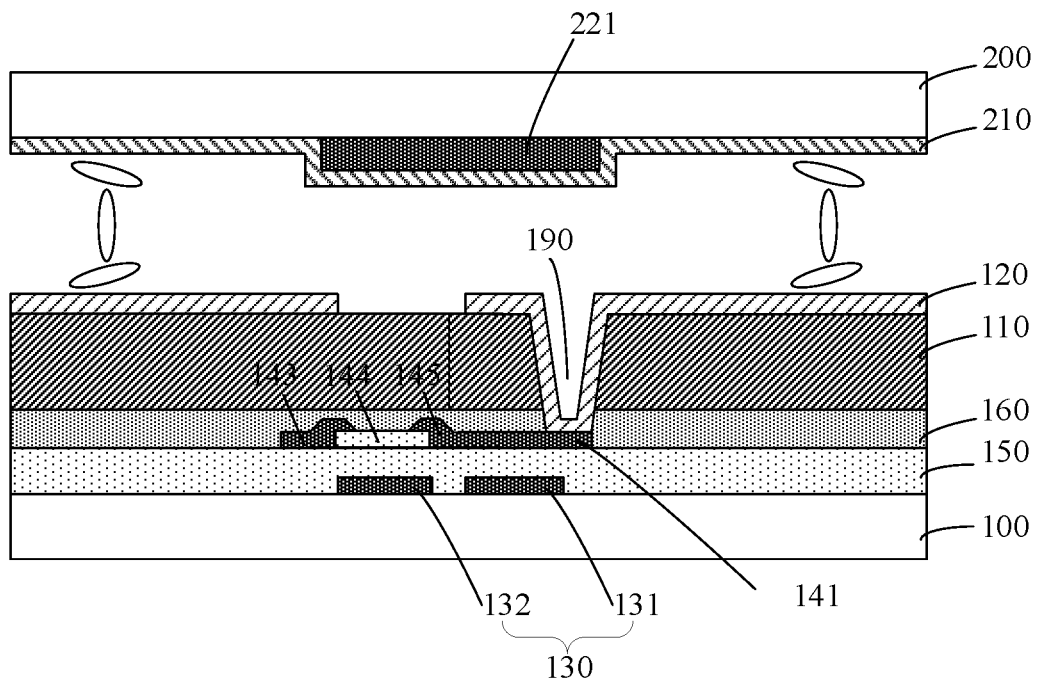
FIG. 7 illustrates a schematic structural view of another exemplary curved display device in accordance with some other embodiments of the present disclosure.

Additionally, a storage capacitor electrode 141 can be disposed in the source/drain electrode, which is electrically connected to the pixel electrode 120 through a via hole, or is electrically connected to the first common electrode through a via hole. As such, without increasing the mask plate exposure number, the problem that the storage capacitance is too small due to an increase of the distance between the pixel electrode and the common electrode caused by adding a color resist can be solved. Therefore, the screen display quality of the curved display device can be improved. FIG. 7 illustrates a schematic structural view of another exemplary curved display device in accordance with some other embodiments of the present disclosure. Referring to FIG. 7, the thin film transistor includes an active layer 144, a source electrode 143, and a drain electrode 145. As shown in FIG. 7, the storage capacitor electrode 141 and the drain electrode 145 of the thin film transistor are integrally connected parts of a unitary electrode block.

Figure 8:
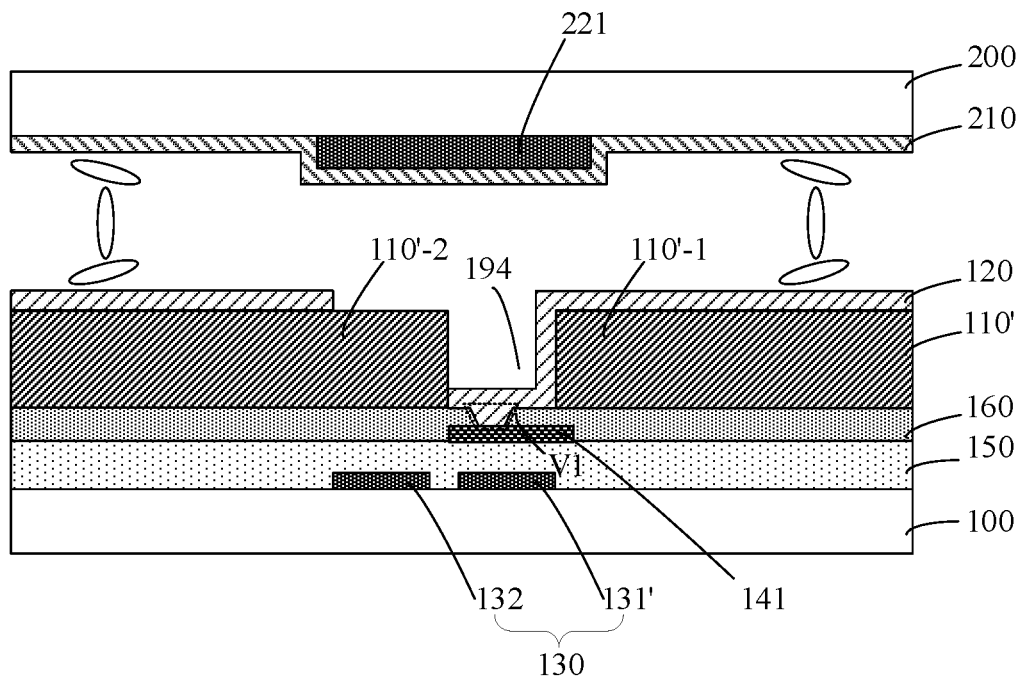
FIG. 8 illustrates a schematic structural view of another exemplary curved display device in accordance with some other embodiments of the present disclosure.
Figure 9:
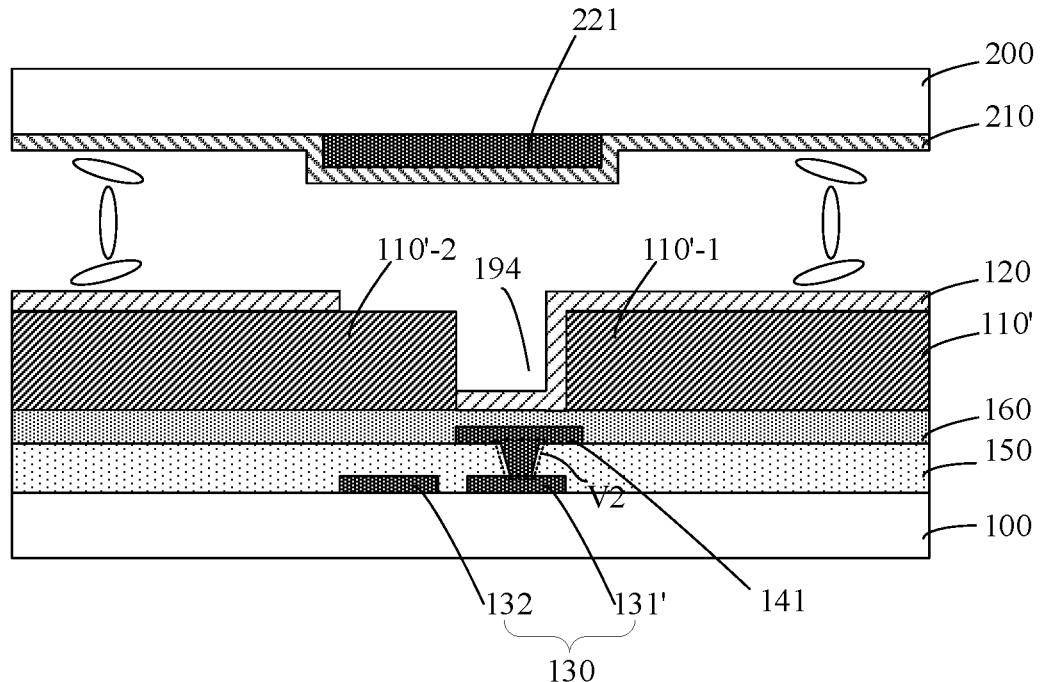
FIG. 9 illustrates a schematic structural view of another exemplary curved display device in accordance with some other embodiments of the present disclosure.
Figure 10:
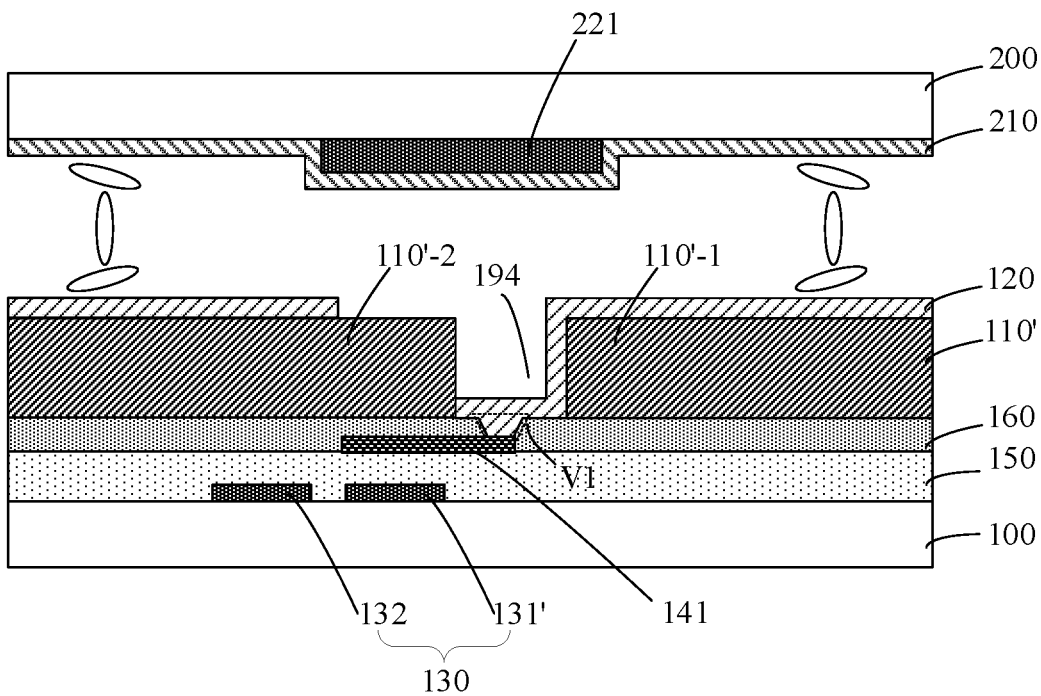
FIG. 10 illustrates a schematic structural view of another exemplary curved display device in accordance with some other embodiments of the present disclosure.
Figure 11:
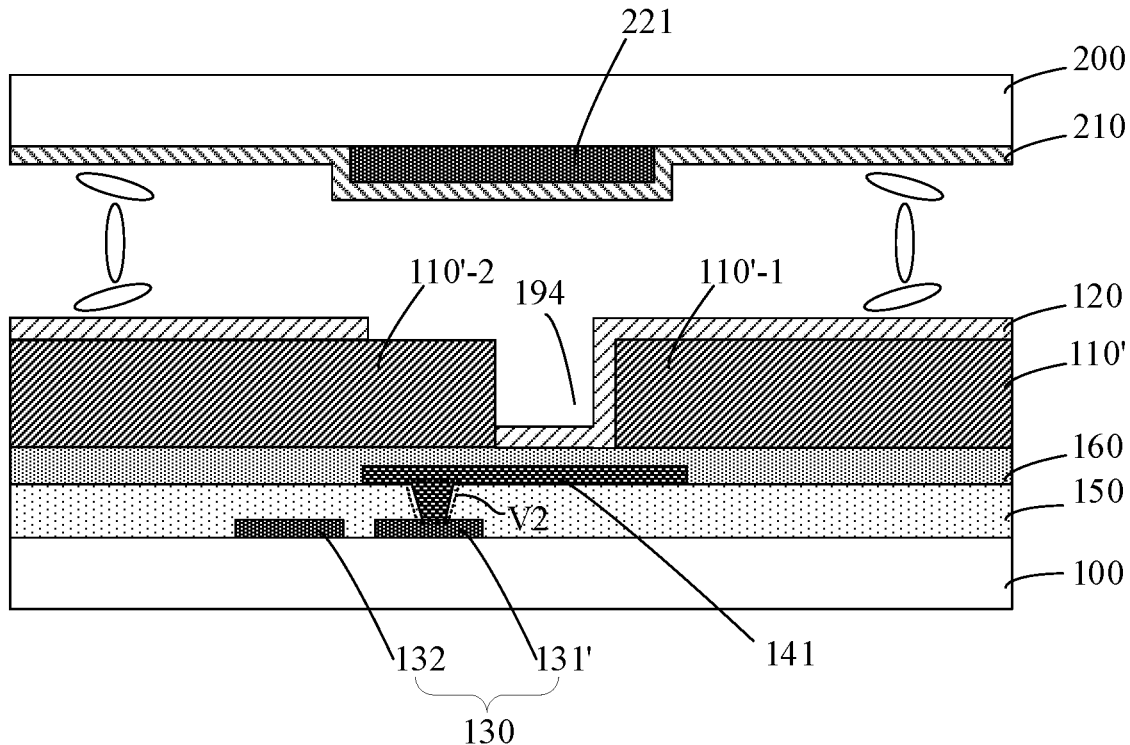
FIG. 11 illustrates a schematic structural view of another exemplary curved display device in accordance with some other embodiments of the present disclosure.

FIG. 8 illustrates a schematic structural view of another exemplary curved display device in accordance with some other embodiments of the present disclosure. FIG. 9 illustrates a schematic structural view of another exemplary curved display device in accordance with some other embodiments of the present disclosure. FIG. 10 illustrates a schematic structural view of another exemplary curved display device in accordance with some other embodiments of the present disclosure. FIG. 11 illustrates a schematic structural view of another exemplary curved display device in accordance with some other embodiments of the present disclosure. Referring to FIGS. 8 to 11, the array substrate in some embodiments includes a first base substrate 100; a first electrode 131' on the first base substrate 100; a first insulating layer 150 on a side of the first electrode 131' away from the first base substrate 100; a storage capacitor electrode 141 on a side of the first insulating layer 150 away from the first electrode 131'; a second insulating layer 160 on a side of the storage capacitor electrode 141 away from the first insulating layer 150; a pixel electrode 120 on a side of the second insulating layer 160 away from the storage capacitor electrode 141; and a color resist 110' over the first base substrate 100 and between the pixel electrode 120 and the second insulating layer 160. The first electrode 131' and the pixel electrode 120 are configured to form a storage capacitor through the storage capacitor electrode 141. The storage capacitor electrode 141 is electrically connected to one but not the other of the first electrode 131' and the pixel electrode 120. The color resist 110' includes sub-color resists having a gap 194 between adjacent sub-color resists (e.g., adjacent sub-color resists 110'-1, 110'-2 in the color resist 110'). The pixel electrode 120 at least partially extends into the gap 194.

Optionally, the first electrode 131' is a first common electrode 131. Optionally, the first common electrode 131 is configured to be provided a common voltage. Referring to FIG. 1, in some embodiments, the first common electrode 131 and the second common electrode layer 210 may be electrically connected to a common voltage signal line in a peripheral area of the display panel. The common voltage signal line is configured to provide a common voltage to the first common electrode 131 and the second common electrode layer 210.

Referring to FIG. 8, in some embodiments, the storage capacitor electrode 141 is electrically connected to the pixel electrode 120, and is insulated from the first electrode 131' by the first insulating layer 150. Optionally, the gap 194 is located in a region corresponding to the first electrode 131'. Optionally, the storage capacitor electrode 141 is electrically connected with the pixel electrode 120 through a first via hole V1 extending through the second insulating layer 160 in a region corresponding to the gap 194. As shown in FIG. 8, an orthographic projection of the first electrode 131' on the first base substrate 100 at least partially overlaps (e.g., substantially overlaps) with an orthographic projection of the storage capacitor electrode 141 on the first base substrate 100. Optionally, the orthographic projection of the first electrode 131' on the first base substrate 100 at least partially overlaps with an orthographic projection of a portion of the pixel electrode 120 in the gap 194 on the first base substrate 100.

Referring to FIG. 9, in some embodiments, the storage capacitor electrode 141 is electrically connected to the first electrode 131', and is insulated from the pixel electrode 120 by the second insulating layer 160. Optionally, the gap 194 is located in a region corresponding to the first electrode 131'. Optionally, the storage capacitor electrode 141 is electrically connected with the first electrode 131' through a second via hole V2 extending through the first insulating layer 150 in a region corresponding to the gap 194. As shown in FIG. 9, an orthographic projection of the first electrode 131' on the first base substrate 100 at least partially overlaps (e.g., substantially overlaps) with an orthographic projection of a portion of the pixel electrode 120 in the gap 194 on the first base substrate 100. Optionally, the orthographic projection of the first electrode 131' on the first base substrate 100 at least partially overlaps with an orthographic projection of the storage capacitor electrode 141 on the first base substrate 100.

Referring to FIG. 10, in some embodiments, the storage capacitor electrode 141 is electrically connected to the pixel electrode 120, and is insulated from the first electrode 131' by the first insulating layer 150. Optionally, the gap 194 is located in a region outside that of the first electrode 131'. Optionally, the storage capacitor electrode 141 is electrically connected with the pixel electrode 120 through a first via hole V1 extending through the second insulating layer 160 in a region corresponding to the gap 194. As shown in FIG. 10, in some embodiments, an orthographic projection of the first electrode 131' on the first base substrate 100 is substantially non-overlapping with an orthographic projection of the pixel electrode 120 on the first base substrate 100. An orthographic projection of the storage capacitor electrode 141 on the first base substrate 100 covers the orthographic projection of the first electrode 131' on the first base substrate 100. The orthographic projection of the storage capacitor electrode 141 on the first base substrate 100 at least partially overlaps with an orthographic projection of a portion of the pixel electrode 120 in the gap 194 on the first base substrate 100.

Referring to FIG. 11, in some embodiments, the storage capacitor electrode 141 is electrically connected to the first electrode 131', and is insulated from the pixel electrode 120 by the second insulating layer 160. Optionally, the gap 194 is located in a region outside that of the first electrode 131'. Optionally, the storage capacitor electrode 141 is electrically connected with the first electrode 131' through a second via hole V2 extending through the first insulating layer 150 in a region outside that of the gap 194. As shown in FIG. 11, in some embodiments, an orthographic projection of the first electrode 131' on the first base substrate 100 is substantially non-overlapping with an orthographic projection of the pixel electrode 120 on the first base substrate 100. An orthographic projection of the storage capacitor electrode 141 on the first base substrate 100 covers an orthographic projection of a portion of the pixel electrode 120 in the gap 194 on the first base substrate 100. The orthographic projection of the storage capacitor electrode 141 on the first base substrate 100 at least partially overlaps with the orthographic projection of the first electrode 131' on the first base substrate 100.

Figure 12:
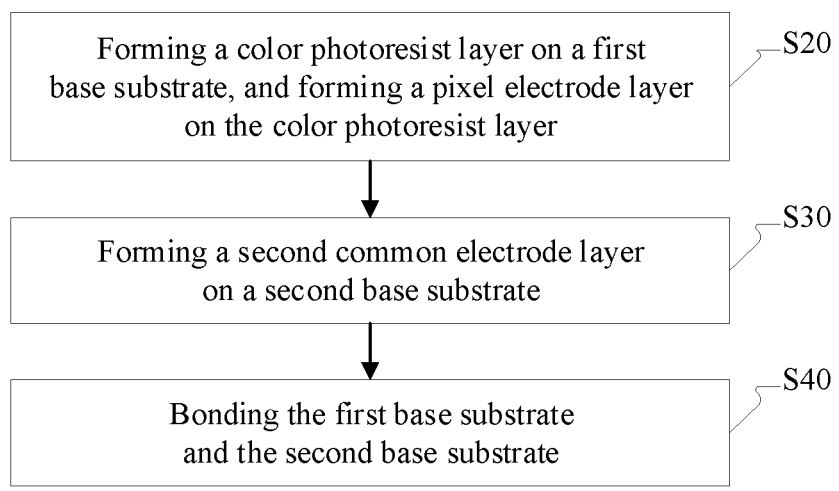
FIG. 12 illustrates a schematic flowchart of an exemplary method for fabricating a curved display device in accordance with some embodiments of the present disclosure.

Accordingly, Referring to FIG. 12, a schematic flowchart of an exemplary method for fabricating a curved display device is shown in accordance with some embodiments of the present disclosure. As illustrated, the method can include the following steps.

At step S20, a color resist can be formed on a first base substrate, and a pixel electrode layer can be formed on the color resist.

At step S30, a second common electrode layer can be formed on a second base substrate.

At step S40, bonding the first base substrate and the second base substrate. For example, the first base substrate can be folded to align to the second base substrate to form a curved display panel.

In the disclosed method for fabricating the curved display device, the color resist is formed on the first substrate on which the pixel electrode layer is provided. As such, in the formed curved display device, each sub-color resist corresponds to a single sub-pixel, so that each sub-pixel has only one color. Therefore, the color mixing problem caused by the misaligned bent upper and lower substrates having multiple color resists with different colors in a same sub-pixel can be effectively solved.

In addition, comparing to the conventional compensation method of widening the black matrixes on the side closed to the color film substrate, in the disclosed method, by providing the color resist on the first substrate on which the pixel electrode layer is provided, not only the problem of color mixing of the curved display device can be solved, but also an alignment tolerance between the first base substrate and the second base substrate can be effectively reduced. Therefore, the width of the black matrixes can be reduced, thereby increasing the transmittance of the curved display device.

In some embodiments, the color resist may be formed on the first base substrate by using any suitable process, including jet printing, pigment dispersing, patterning printing, etc. Illustratively, the color resist can include a red region, a green region, and a blue region that are separately formed in three stages.

For example, a red region can be first formed: a red resist resin film can be coated on the first base substrate, and be exposed and developed by using a corresponding mask plate to obtain the red region. Then, a green region can be formed: a green resist resin film can be coated on the entire first base substrate, and be exposed and developed by using a corresponding mask plate to obtain the green region. Finally, a blue region can be formed: a blue resist resin film can be coated on the entire first base substrate, and be exposed and developed by using a corresponding mask plate to obtain the blue region. After the above-described process, a color filter layer can be formed on the first base substrate.

A specific process for forming the pixel electrode layer on the color resist can include the following. A pixel electrode layer can be formed on the first base substrate on which the color resist is formed, and the pixel electrode layer can be patterned by a patterning process. Illustratively, a transparent conductive layer may be formed on the first base substrate on which the color resist is formed by using any suitable method including deposition, sputtering, coating, etc. Then a resist film can be coated on the transparent conductive layer. A mask plate having a pattern including a pixel electrode can be used to mask the transparent conductive layer coated with a resist. After the exposing, developing, etching, and any other necessary steps, a pattern including a pixel electrode can be formed.

Further, prior to forming the color resist, the method can further include a step S10 for forming a first common electrode on the first base substrate, and forming a storage capacitor electrode on the first common electrode. When forming the pixel electrode layer, the method can further include a step S21 for electrically connecting the pixel electrode in the pixel electrode layer to the storage capacitor electrode block.

Specifically, a process for forming the storage capacitor electrode on the first common electrode can be forming a source/drain electrode including a storage capacitor electrode on the first common electrode. Exemplary formation process of the source/drain electrode including the storage capacitor electrode may be the following. By using plasma enhanced chemical vapor deposition, sputtering, or thermal evaporation, or any other suitable method, a source/drain electrode can be formed on the first base substrate on which the first common electrode and the gate insulation layer are formed. A resist film can be coated on the source/drain electrode. A mask plate having patterns of source electrode, drain electrode, and storage capacitor electrode can be used to mask the source/drain electrode coated with the resist film. After the exposing, developing, etching, and any other necessary steps, a pattern of source/drain electrode including the storage capacitor electrode can be formed.

A process for electrically connecting the pixel electrode in the pixel electrode layer to the storage capacitor electrode may specifically include the following. A via hole can be formed in the color resist between the pixel electrode layer and the storage capacitor electrode block. During the process for forming the pixel electrode layer, the pixel electrode in the pixel electrode layer can be electrically connected to the storage capacitor electrode through the via hole.

In some other embodiments, prior to forming the color resist, the method can further include a step S10' for forming a first common electrode on the first base substrate, forming a storage capacitor electrode on the first common electrode and opposite to the first common electrode, and electrically connecting the first common electrode and the storage capacitor electrode with each other.

Specifically, a source/drain electrode including the storage capacitor electrode can be formed on the first common electrode. And the storage capacitor electrode can be formed opposite to the first common electrode. A via hole can be formed in a film layer between the storage capacitor electrode and the first common electrode. During the process for forming the storage capacitor electrode block, the storage capacitor electrode can be electrically connected to the first common electrode through the via hole.

In addition, after forming the color resist and before forming the pixel electrode layer, the method can further include a step S22 for forming an organic film layer on the color resist. The organic film layer can be formed on the a first base substrate on which a color resist is formed by using any suitable method include plasma enhanced chemical vapor deposition, sputtering, coating, thermal evaporation, etc.

In some other embodiments, prior to forming the color resist, the method can further include a step S10" for forming a first common electrode on the first base substrate. The process for forming the color resist can specifically include forming a color resist having a gap between adjacent sub-color resists, and the gap being opposed to the first common electrode. The process for forming the pixel electrode layer can specifically include forming the pixel electrode layer on the sub-color resists and at least partially in the gap.

In the disclosed method for fabricating the curved display device, the color resist can be moved from the conventional location of one side of color resist to the array substrate, which is the first base substrate described above. In the formed pixel structure, each sub-color resist can correspond to a single sub-pixel, so that each sub-pixel has only one color. Therefore, the color mixing problem caused by the misaligned bent upper and lower substrates having multiple color resists in a same sub-pixel can be effectively solved.

Further, since the pixel electrode layer and the color resist are both disposed on the first base substrate without performing the alignment step, the fabrication process of the first base substrate can be simplified.

Additionally, the storage capacitor electrode can be formed in the source/drain electrode, which is electrically connected to the pixel electrode through a via hole, or is electrically connected to the first common electrode through a via hole. As such, without increasing the mask plate exposure number, the problem that the storage capacitance is too small due to an increase of the distance between the pixel electrode and the common electrode caused by adding a color resist can be solved. Therefore, the screen display quality of the curved display device can be improved.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, an LCD panel and a related LCD device are provided.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways. Without departing from the spirit and scope of the present disclosure, modifications, equivalents, or improvements to the present disclosure are understandable to those skilled in the art and are intended to be encompassed within the scope of the present disclosure.

What is claimed is:

1. An array substrate, comprising:
   a first base substrate;
   a first electrode on the first base substrate;
   a first insulating layer on a side of the first electrode away from the first base substrate;
   a storage capacitor electrode on a side of the first insulating layer away from the first electrode;
   a second insulating layer on a side of the storage capacitor electrode away from the first insulating layer; and
   a pixel electrode on a side of the second insulating layer away from the storage capacitor electrode;
   wherein the storage capacitor electrode is electrically connected to one but not the other of the first electrode and the pixel electrode;
   the first electrode and the pixel electrode are configured to form a storage capacitor through the storage capacitor electrode; and
   an orthographic projection of the storage capacitor electrode on the first base substrate at least partially overlaps with an orthographic projection of the other of the first electrode and the pixel electrode on the first base substrate.

2. The array substrate of claim 1, wherein the storage capacitor electrode and a drain electrode of a thin film transistor are integrally connected parts of a unitary electrode block.

3. The array substrate of claim 1, further comprising a color resist over the first base substrate and between the pixel electrode and the second insulating layer.

4. The array substrate of claim 3, wherein the color resist includes sub-color resists having a gap between adjacent sub-color resists; and
   the pixel electrode is at least partially in the gap.

5. The array substrate of claim 4, wherein the gap is located in a region corresponding to the first electrode.

6. The array substrate of claim 5, wherein the storage capacitor electrode is electrically connected with the pixel electrode through a via hole extending through the second insulating layer in a region corresponding to the gap.

7. The array substrate of claim 6, wherein an orthographic projection of the first electrode on the first base substrate at least partially overlaps with the orthographic projection of the storage capacitor electrode on the first base substrate; and
   the orthographic projection of the first electrode on the first base substrate at least partially overlaps with an orthographic projection of a portion of the pixel electrode in the gap on the first base substrate.

8. The array substrate of claim 5, wherein the storage capacitor electrode is electrically connected with the first electrode through a via hole extending through the first insulating layer in a region corresponding to the gap.

9. The array substrate of claim 8, wherein an orthographic projection of the first electrode on the first base substrate at least partially overlaps with an orthographic projection of a portion of the pixel electrode in the gap on the first base substrate; and
   the orthographic projection of the first electrode on the first base substrate at least partially overlaps with the orthographic projection of the storage capacitor electrode on the first base substrate.

10. The array substrate of claim 4, wherein the gap is located in a region outside that of the first electrode.

11. The array substrate of claim 10, wherein the storage capacitor electrode is electrically connected with the pixel electrode through a via hole extending through the second insulating layer in a region corresponding to the gap.

12. The array substrate of claim 11, wherein an orthographic projection of the first electrode on the first base substrate is substantially non-overlapping with an orthographic projection of the pixel electrode on the first base substrate;
   the orthographic projection of the storage capacitor electrode on the first base substrate covers the orthographic projection of the first electrode on the first base substrate; and the orthographic projection of the storage capacitor electrode on the first base substrate at least partially overlaps with an orthographic projection of a portion of the pixel electrode in the gap on the first base substrate.

13. The array substrate of claim 10, wherein the storage capacitor electrode is electrically connected with the first electrode through a via hole extending through the first insulating layer in a region outside that of the gap.

14. The array substrate of claim 13, wherein an orthographic projection of the first electrode on the first base substrate is substantially non-overlapping with an orthographic projection of the pixel electrode on the first base substrate;
the orthographic projection of the storage capacitor electrode on the first base substrate covers an orthographic projection of a portion of the pixel electrode in the gap on the first base substrate; and
the orthographic projection of the storage capacitor electrode on the first base substrate at least partially overlaps with the orthographic projection of the first electrode on the first base substrate.

15. The array substrate of claim 4, wherein each sub-color resist in the color resist corresponds to a single sub-pixel.

16. The array substrate of claim 1, wherein an orthographic projection of the storage capacitor electrode on the first base substrate substantially covers an orthographic projection of the first electrode on the first base substrate.

17. The array substrate of claim 1, further comprising a source/drain electrode, wherein the storage capacitor electrode is in a same layer as the source/drain electrode.

18. The array substrate of claim 1, further comprising a gate electrode, wherein the first electrode is in a same layer as the gate electrode.

19. A display panel, comprising:
the array substrate according to claim 1;
a second base substrate; and
a second electrode on the second base substrate;
wherein the pixel electrode in the array substrate and the second electrode are placed toward each other to assemble the first base substrate with the second base substrate;
the first electrode is a first common electrode;
the second electrode is a second common electrode;
the first common electrode and the second common electrode are electrically connected to a common voltage signal line in a peripheral area of the display panel; and
the common voltage signal line is configured to provide a common voltage to the first common electrode and the second common electrode.

20. A method for forming an array substrate, comprising:
forming a first electrode on a first base substrate;
forming a first insulating layer on a side of the first electrode away from the first base substrate;
forming a storage capacitor electrode on a side of the first insulating layer away from the first electrode;
forming a second insulating layer on a side of the storage capacitor electrode away from the first insulating layer; and
forming a pixel electrode on a side of the second insulating layer away from the storage capacitor electrode;
wherein the storage capacitor electrode is formed to be electrically connected to one but not the other of the first electrode and the pixel electrode;
the first electrode and the pixel electrode are configured to form a storage capacitor through the storage capacitor electrode; and
an orthographic projection of the storage capacitor electrode on the first base substrate at least partially overlaps with an orthographic projection of the other of the first electrode and the pixel electrode on the first base substrate.

* * * * *